United States Patent [19]
MacDonald et al.

[11] Patent Number: 5,094,536
[45] Date of Patent: Mar. 10, 1992

[54] DEFORMABLE WAFER CHUCK

[75] Inventors: Bruce G. MacDonald, San Diego; Robert O. Hunter, Jr., Rancho Santa Fe; Adlai H. Smith, San Diego, all of Calif.

[73] Assignee: Litel Instruments, San Diego, Calif.

[21] Appl. No.: 609,816

[22] Filed: Nov. 5, 1990

[51] Int. Cl.$^5$ .................................................. G01J 1/00
[52] U.S. Cl. .................................... 356/358; 356/359; 250/491.1
[58] Field of Search ............... 356/359, 358, 357, 371, 356/244; 350/607, 611, 360; 250/491.1; 355/52

[56] References Cited

U.S. PATENT DOCUMENTS

| | | | |
|---|---|---|---|
| 4,291,990 | 9/1981 | Takasu | 356/371 |
| 4,475,223 | 10/1984 | Taniguchi | 250/491.1 |
| 4,923,302 | 5/1990 | Ealey et al. | 356/371 |
| 4,934,803 | 6/1990 | Ealey | 350/607 |
| 4,943,148 | 6/1990 | Mondragen et al. | 356/244 |
| 5,008,702 | 4/1991 | Tanaka et al. | 355/52 |

Primary Examiner—Samuel A. Turner
Assistant Examiner—Richard Kurtz, II.
Attorney, Agent, or Firm—Brown, Martin, Haller & McClain

[57] ABSTRACT

The deformable wafter chuck system includes a base with a recess having a diameter slightly smaller than the diameter of the wafer to be held. The base may have one or more orifices or channels running therethrough for distributing a vacuum to secure the wafer to the chuck, or it may have a plurality of clips attached at the rim of the chuck for holding the wafer. Attached to the chuck within the recess is a plurality of distortive actuators, such as piezoelectric crystals, which cause the wafer to be selectively deformed to assume arbitrary shapes, cancelling the warpage of the wafer to permit reduced distortion of the projected pattern. An interferometer system is included to combine light reflected from the wafer surface with a portion of incoming light modulated by a mask or reticle, thereby forming an interference pattern. The interference pattern is sued by a computer to determine warpage-induced distortions to activate the actuators to provide realtime correction of wafer flatness and also permits adjustment of depth of focus by varying heights of portions of the wafer.

15 Claims, 2 Drawing Sheets

DEFORMABLE WAFER CHUCK

BACKGROUND OF THE INVENTION

Lithography is a key factor in the drive for higher levels of micro-circuit integration. Dynamic RAMs have quadrupled in the level of integration every three years as a result of the reduction in minimum geometries and increases in chip size. As minimum geometries approach 0.5 μm and below, lithography alternatives include optics, electron beam direct write, X-ray and electron/ion beam proximity technologies. The latter three technologies are still in their infancy relative to optical lithography and still have obstacles to overcome, including decreased throughput, low source brightness and mask complexity, respectively.

While optical lithography continues to be the dominant technology because it is well established and is capable of implementing sub-micron resolution at least as low as 0.35 μm, efforts into attaining smaller geometries are looking toward the newer technologies. In both optical lithography and its alternatives, progress into the realm of shorter wavelengths introduces increased sensitivities to minute surface imperfections including contaminants on optical surfaces, aberrations introduced by lenses and mirrors, photoresist thickness and surface variations and wafer flatness and planarity.

Addressing the issue of wafer flatness in particular, ideally, perfect flatness could be maintained at the patterning steps of the process by using the proper vacuum chuck. The wafer chuck of a stepper is commonly mounted on air bearings with precision x-y control for fine adjustment and smooth motion. The surface of the wafer chuck is generally presumed flat and movement of the chuck is tightly controlled to prevent height variations with lateral motion. However, assuming the wafer chuck and its motion are perfectly flat, there is no assurance that the wafer or photoresist layer themselves are flat in a scan from one point of the wafer to another. While wafer flatness can be a cause of a focus problem at any exposure wavelength, the problem becomes particularly pronounced in the sub-micron range where the amount of deformation approaches both the exposure wavelength and minimum dimension. Also, as larger fields are utilized, processing many die in one field, it may even be desirable to deform a perfectly flat wafer to provide an acceptable depth of focus for very large fields.

A small amount of wafer warpage can be expected due to repeated high temperature steps during processing and the compressive strains introduced by patterned features having different coefficients of expansion. Other factors in susceptibility to warpage are wafer thickness and orientation. Further, feature step heights in non-planarized processes can cause surface irregularities within the photoresist resulting in variations in exposure from the top to the bottom of a step.

It is known that wavefront aberrations can be corrected by introducing the phase conjugate of the aberration into an optical element such as a lens or mirror. For example, chromatic variations can be corrected by selected refractive index differences in a lens.

The correction of aberrated wavefronts reflected from a mirrored surface and the addition of known distortions to laser signals is known and has particularly been used in ground-based telescopes where aberrations are caused, for example, by thermal gradients, atmospheric turbulence, and the optical system. Selective local deformation of a mirror's reflecting surface may be achieved by the use of distortive actuators which are selectively energized by the application of electrical signals thereto to produce mechanical forces upon the rear surface of the mirror. Precise control of the distortions introduced into the mirror's reflecting surface may be achieved by spacing the actuators close to each other and by having the surface area of the mirror influenced by each actuator being kept as small as possible, and by making the structure which carries the reflecting surface as flexible as possible. Such a mirror may consist of a single thin sheet of reflective material as disclosed in U.S. Pat. No. 4,655,563 or may be a segmented mirror as disclosed in U.S. Pat. No. 4,944,580.

It is further known that wafers, in spite of their apparent brittleness, are capable of limited flex and deformation, similar to a thin sheet of glass. If this characteristic were not present, wafers would break under the differential strains produced by selective deposition and removal of thin films on the wafer and the high temperature processing of those films.

It would be desirable to provide a wafer chuck for use in a lithography system which is capable of selectively deforming portions of a wafer and taking advantage of a wafer's flexibility to compensate for warpage of the unprocessed wafer and warpage induced during processing, thus permitting highly accurate level-to-level alignment and providing better control of uniformity of dimensions of the projected pattern. It is to such a device that the present invention is directed.

SUMMARY OF THE INVENTION

It is an advantage of the present invention to provide a wafer chuck which is capable of selectively deforming the wafer to compensate for warpage and non-uniformities in the flatness of the wafer.

It is a further advantage of the present invention to provide a feedback system which permits realtime computer controlled deformation of the wafer with computer control being dependent upon interferometric feedback from the wafer indicating depth of focus and distortion measurement.

In an exemplary embodiment, the deformable wafer chuck includes a base with a recess having a diameter slightly smaller than the diameter of the wafer to be held. The base may have one or more orifices or channels running therethrough for distributing a vacuum to secure the wafer to the chuck, or it may have a plurality of clips attached at the rim of the chuck for holding the wafer. Attached to the chuck within the recess is a plurality of distortive actuators, such as piezoelectric crystals, which contact the wafer backside causing the wafer to be selectively deformed to assume arbitrary shapes cancelling the warpage of the wafer to permit reduced distortion from the desired projected pattern.

An interferometer system is included to combine light reflected from the wafer surface with a portion of incoming light, thereby forming an interference pattern which provides a map of optical path differences between the incoming and reflected light. The interference pattern is used by a computer to determine warpage - induced distortions to provide realtime correction of wafer flatness. The system also measures heights of portions of the wafer in conjunction with interferometers or other detectors within the optical system.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
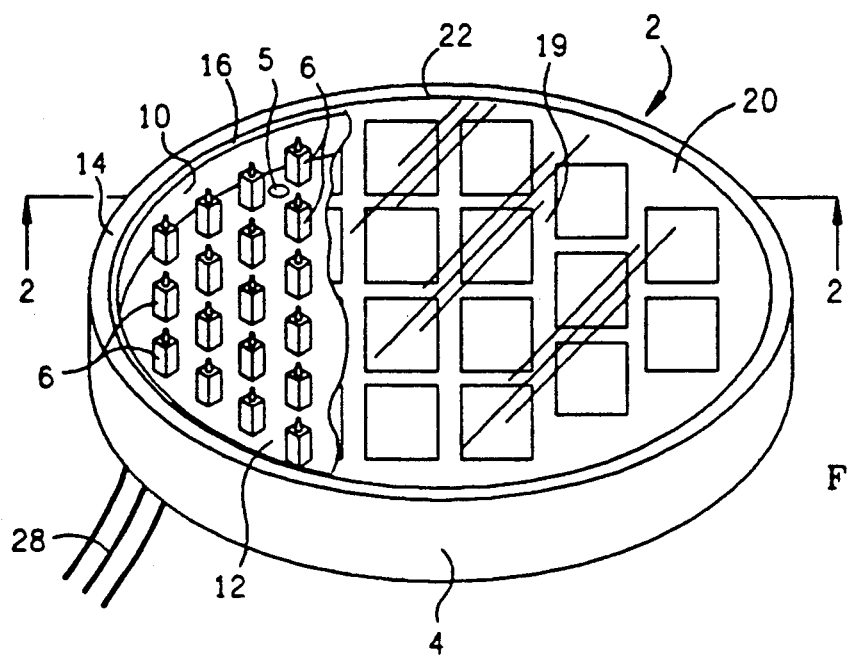
FIG. 1 is a perspective view of a wafer mounted on a wafer chuck according to the present invention, with the wafer partially cut away.
Figure 2:
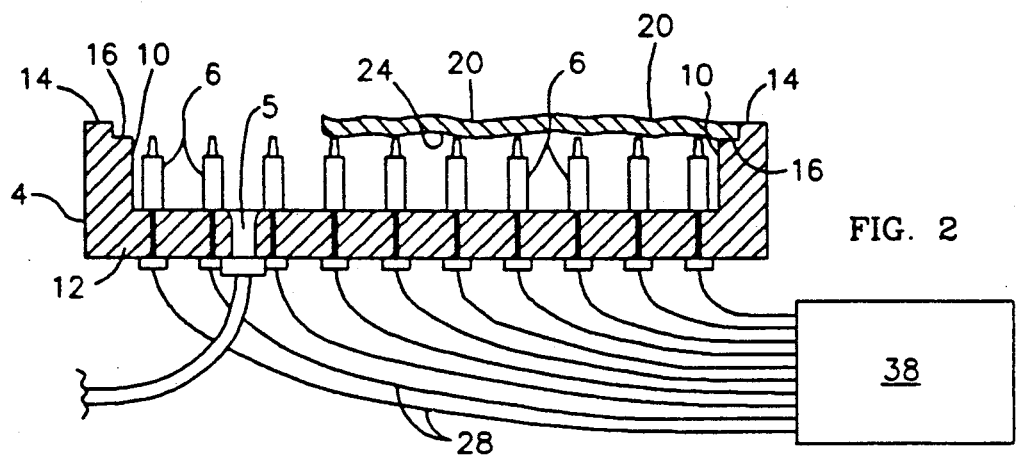
FIG. 2 is a cross-sectional elevation taken along line 2—2 of FIG. 1.

As illustrated in FIGS. 1 and 2, the deformable wafer chuck 2 comprises a base 4 onto which are attached a plurality of variable length actuators 6 such as piezoelectric crystals. Each actuator 6 has an extension pin 8 at its upper surface. Base 4 has a recessed area 10 which comprises a large portion of its area, the diameter of the recessed area 10 being slightly smaller than the diameter of the wafer 20 to be held on the chuck 2. At least one port 5 is provided in the bottom 12 of base 4 through which a vacuum may be applied to recessed area 10. Chuck rim 14 surrounds the entire recessed area 10 and itself has a slight depression 16 which generally conforms to the perimeter of the wafer 20, including appropriate indentations to correspond to flats 22 of the wafer 20 to facilitate alignment.

Contained within recessed area 10 are the actuators 6. The denser the packing of actuators 6, the more precise the degree of deformation can be controlled. The extension pin 8 provides a small single point of contact to the wafer backside 24. Each actuator has a length such that the tip 18 of pin 8 is co-planar with the rim of depression 16 so that a perfectly flat wafer would be contacted at its perimeter by the rim of depression 16 and within its center area by the tip 18 of each pin 8.

Also running through the bottom 12 are a plurality of connectors 28 for supplying electrical signals to the actuators 6, with one connector 28 corresponding to each actuator 6.

Figure 4:
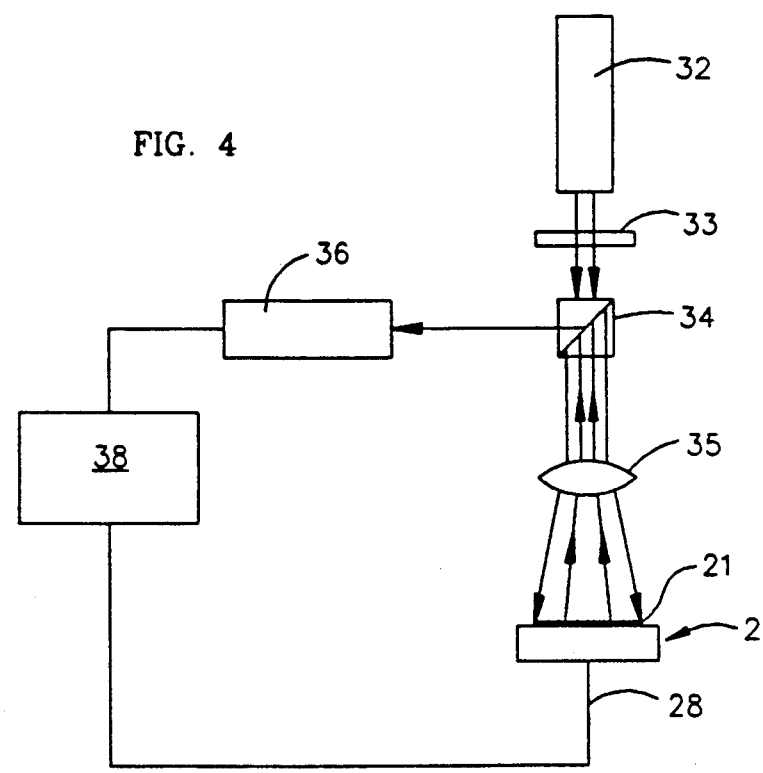
FIG. 4 is a diagrammatic view of the wafer chuck and interferometer system according to the present invention.

As illustrated in FIG. 4, the electrical signals for driving the actuators 6 are provided by an interferometer system which includes a coherent light source 32, a beamsplitter 34, an interferometric camera 36 and a computer 38.

Light source 32 is preferably a laser emitting at a longer wavelength than that used for exposure of the photoresist. At this point a lesser degree of spatial resolution is necessary for measuring flatness and it is important that the light not cause a reaction in the photoresist. A suggested light source 32 would be a helium-neon laser (632.8 nm), for example, which is capable of transmission through photoresist to be reflected by the wafer surface. Preferably, however, a two-color laser would be used to both look through the photoresist and at the surface of the photoresist, providing flatness information for both the wafer and the photoresist. Alternately, the light source used for exposure of the photoresist may be used, but flatness will only be measured during actual exposure and will not permit adjustment of flatness prior to exposure.

The beamsplitter 34 is disposed between the light source 32 and the wafer 20 so that a portion of the incident light 31 and a portion of light reflected from the face 21 of the wafer 20 due to its highly polished finish are redirected toward the interferometric camera 36. A lens or a series of lenses or other optical elements may be generally disposed between the source 32 and the wafer 20, as represented by lens 35.

The combination of the incident and reflected light generates an interference fringe providing a map of optical path difference between the incident and reflected light. The optical path difference will be measured at selected areas within the scribe lanes 19 of the patterned wafer 20, as shown in FIG. 1. The selected areas may be a pattern within the scribe lane 19 specifically intended for flatness measurement or may merely be within the scribe lane 19 itself, the only criteria being an absence of steps to avoid diffraction from the step edges. Interferometric camera 36 detects the interference fringe pattern, converting the detected pattern into a signal by which the computer 38 determines which actuators 6 need to be activated and the degree of activation required for each according to a library of preprogrammed algorithms. The computer 38 then individually addresses and provides an electrical signal to the actuators 6 as determined from the interference fringe to cause distortion of the wafer 20 to correct for warpage or other surface irregularities related to flatness and which may effect localized focus of a projected pattern on the wafer. The interferometer system provides a continuous optical path difference map even during exposure to permit compensation for wafer warpage due to heating under exposure conditions.

The information on wafer surface flatness may be stored or monitored by the computer 38 to provide an assessment of the cause of warpage (such as a particle on a pin). Even if the measurement is out of the control range of the wafer chuck 2, realtime monitoring will indicate the cause of the warpage as being something (a particle) between the pin 8 and the wafer backside 24.

Figure 3:
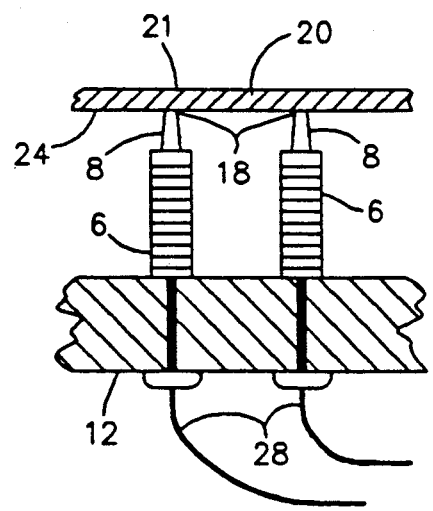
FIG. 3 is a detail view of two actuators as shown in FIG. 2.

The actuators 6 are constructed of any material which exhibits elongation or shortening when an electrical signal is applied thereto, for example PMN (lead magnesium niobate), PZT (lead zirconium titanate) or PLZT (lead lanthanum zirconium titanate). As illustrated in FIG. 3, extension pins 8 are attached to the top portion of each actuator 6 by, for example, brazing or epoxy. The small tip 18 permits fine control of wafer deformation. The pins 8 are preferably made from a material which will not introduce mobile ions or other contaminants onto the wafer backside 24. Suggested materials are silicon, silicon dioxide, aluminum oxide, or any hard ceramic or metal which will not deform with the pressures induced between the actuator 6 and the wafer 20, and will not introduce contaminants into the wafer.

Within the ranges of the actuators 6, the wafer chuck 2 can perform depth of focus adjustment as well as leveling. This eases the mechanical requirements on the wafer stage greatly and reduces the time required for this adjustment. The mass to be moved, i.e., the actuators 6, base 4 and wafer 20 combined mass, is much less than that of a conventional stage or lens which weighs up to one hundred pounds. This further facilitates higher throughout and can be used in conjunction with interferometers or other detectors which provide an AC signal.

Figure 5:
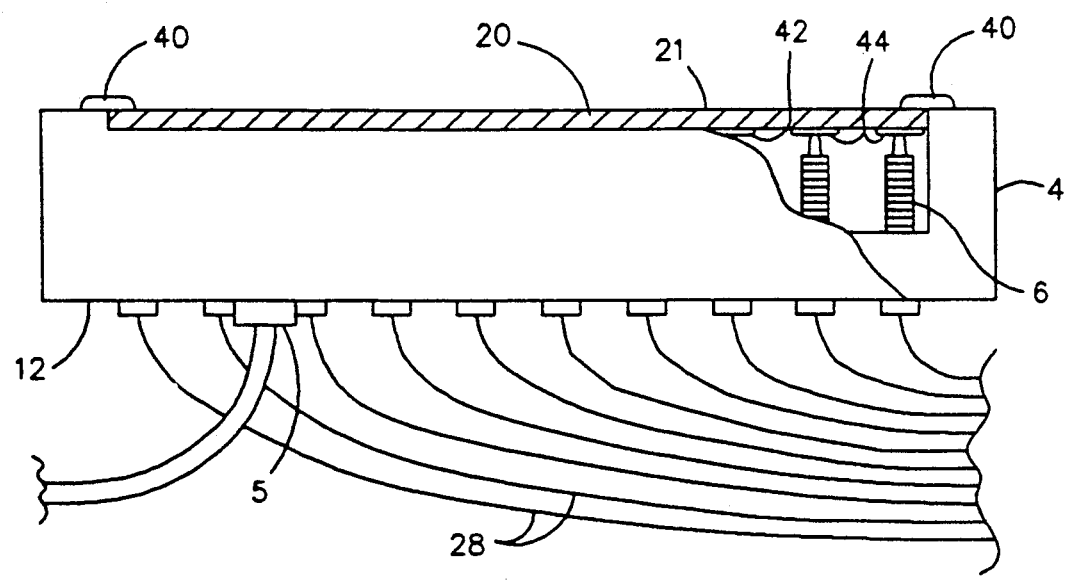
FIG. 5 is a side elevation of an alternative embodiment, partially cut away.

In an alternative embodiment, shown in FIG. 5, a top surface 42 and clips 40 are added, and may be supplemented by a vacuum system with channels 44 running through top surface 42. Top surface 42 and clips 40 will preferably be made of a material similar to that described above for pins 8. This embodiment is, however, less desirable than the first embodiment in that particulates between the top surface 42 and the wafer 20 will introduce additional warpage, while the particulates would fall into recessed area 10 without contacting the wafer backside 24 in the first embodiment.

Variability of the wafer flatness also facilitates depth of focus adjustment. The ability to manipulate the chuck to present different die portions of the wafer at different heights permits extremely fine control of focus characteristics.

The wafer chuck of the present invention permits realtime adjustment of wafer flatness and depth of focus for any type of photolithographic system, including those which use conventional alignment techniques or autofocus sensors.

It will be evident that there are additional embodiments which are not illustrated above but which are clearly within the scope and spirit of the present invention. The above description and drawings are therefore intended to be exemplary only and the scope of the invention is to be limited solely by the appended claims.

We claim:

1. A chuck system for selectively deforming a wafer to permit continuous real time localized manipulation of the flatness of said wafer comprising:
   a base portion;
   a means for securing said wafer to said base portion;
   a plurality of distortive actuators attached to said base portion, each of said actuators being capable of selectively deforming said wafer upon application of electrical signals to one or more of said actuators;
   a pin extending upwardly from each of said plurality of distortive actuators;
   a means for projecting incident light onto said wafer so that said wafer reflects a portion of said incident light;
   a means for combining a portion of said incident light and said reflected light so that an interference fringe is formed;
   a means for detecting said interference fringe to generate a map of optical path difference; and
   a means for converting said map into at least one electrical signal to drive one or more of said actuators.

2. A chuck system as in claim 1 wherein said securing means comprises a plurality of clips disposed in an edge of said base portion, each clip compressing an edge portion of said wafer against said base portion.

3. A check system as in claim 1 wherein said securing means comprises at least one vacuum channel disposed in said base portion for pulling said wafer against said base portion.

4. A chuck system as in claim 1 wherein said projecting means comprises a laser.

5. A chuck system as in claim 4 wherein said laser emits at a wavelength longer than a wavelength emitted by an exposure light source.

6. A chuck system as in claim 4 wherein said laser emits at two different colors for measuring flatness of both said wafer and a film covering said wafer.

7. A chuck system as in claim 1 wherein said combining means comprises a beamsplitter.

8. A chuck system as in claim 1 wherein said converging means comprises an interferometer system which receives said interference map therefrom and converts said fringe into an electrical signal to drive one or more of said actuators.

9. A chuck system for selectively deforming a wafer to permit continuous real time localized manipulation of the flatness of said wafer, said chuck system comprising:
   a base portion;
   a securing means for holding said wafer on said base portion;
   a plurality of distortive actuators, each of said actuators being fastened to said base portion and being capable of selectively deforming said wafer upon application of electrical signals to one or more of said actuators;
   a light source for projecting incident light onto said wafer so that said wafer reflects a portion of said incident light;
   a beamsplitter disposed between said light source and said wafer to deflect a portion of the incident light and a portion of light reflected by said wafer; and
   an interferometer system to receive and combine light deflected by said beamsplitter and generate an interference pattern therefrom, said interference pattern being used to generate a map of optical path difference for determining how said wafer should be deformed to manipulate its flatness.

10. A chuck system as in claim 9 wherein said interferometer comprises a detector and a computer, said detector converting said interference pattern into a signal and said computer converting said signal into at least one electrical signal to drive one or more of said actuators.

11. A chuck system as in claim 9 wherein said light source comprises a laser.

12. A chuck system as in claim 11 wherein said laser emits light at two different wavelengths.

13. A method for manipulating wafer deformation in response to continuous real time monitoring of spacing between a projection system and a wafer having a plurality of subfields, said method which comprises:
   mounting said wafer on a deformable wafer chuck;
   projecting a first beam of laser light toward a subfield of said wafer;
   splitting off a first portion of said first beam;
   reflecting a second portion of said first beam from a first surface on said subfield;
   recombining said first portion and said second portion of said first beam;
   generating a first interference fringe pattern representing a first spacing between said projection system and said first surface of said subfield;
   converting said first interference fringe pattern into an electrical signal;
   driving at least one of a plurality of distortive actuators of said deformable wafer chuck corresponding to said subfield by at least one electrical signal to deform said wafer to achieve a desired spacing between said projection system and said subfield;
   repeating measurement for other subfields of said plurality.

14. A method as in claim 13 wherein the step of generating a first interference fringe comprises continuous generation of a sequence of interference fringes to monitor said spacing throughout a processing step on said wafer.

15. A method as in claim 13 further comprising:
projecting a second beam of laser light having a different wavelength than a wavelength of said first beam;
splitting off a first portion of said second beam;
reflecting a second portion of said second beam from a second surface on said subfield;
recombining said first portion of said second beam and said second portion of said second beam;
generating a second interference fringe pattern representing a second spacing between said projection system and said second surface on said subfield; and
converting said second interference fringe pattern into a second electrical signal.

* * * * *

UNITED STATES PATENT AND TRADEMARK OFFICE
CERTIFICATE OF CORRECTION

PATENT NO. : 5,094,536
DATED : March 10, 1992
INVENTOR(S) : Bruce G. MacDonald, et al It is certified that error appears in the above-indentified patent and that said Letters Patent is hereby corrected as shown below:

Column 6, line 6, "converg-" should read --"convert"--.

Signed and Sealed this

Twentieth Day of July, 1993

Attest:

MICHAEL K. KIRK

*Attesting Officer*     Acting Commissioner of Patents and Trademarks